United States Patent
Ueda et al.

(10) Patent No.: US 7,452,961 B2
(45) Date of Patent: Nov. 18, 2008

(54) POLYMER FILM AND POLYMER FILM DEVICE USING SAME

(75) Inventors: Masato Ueda, Tsukuba (JP); Chizu Sekine, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 488 days.

(21) Appl. No.: 10/520,612

(22) PCT Filed: Jul. 8, 2003

(86) PCT No.: PCT/JP03/08637

§ 371 (c)(1),
(2), (4) Date: Jan. 10, 2005

(87) PCT Pub. No.: WO2004/005379

PCT Pub. Date: Jan. 15, 2004

(65) Prior Publication Data

US 2006/0043358 A1   Mar. 2, 2006

(30) Foreign Application Priority Data

Jul. 9, 2002   (JP)   ............... 2002-199750

(51) Int. Cl.
*C08G 75/00* (2006.01)
*H01L 29/08* (2006.01)
(52) U.S. Cl. ............ 528/377; 528/373; 528/380; 528/425; 428/690; 428/917; 257/40
(58) Field of Classification Search ............ 528/373, 528/377, 380, 425; 257/40; 428/690, 917
See application file for complete search history.

(56) References Cited

U.S. PATENT DOCUMENTS 5,958,609 A * 9/1999 Ueda et al. ............ 428/690

FOREIGN PATENT DOCUMENTS

| JP | 09-83040 A | 3/1997 |
| JP | 2000-252065 | 9/2000 |
| JP | 2003-176337 | 6/2003 |
| JP | 2004-002703 | 1/2004 |
| WO | WO 00/42668 A1 | 7/2000 |
| WO | WO 00/79617 A1 | 12/2000 |

OTHER PUBLICATIONS

H. Sirringhaus et al., "Mobility enhancement in conjugated polymer field-effect transistors through chain alignment in a liquid-crystalline phase", *Applied Physics Letters*, vol. 77, No. 3, Jul. 17, 2000, pp. 406-408.

* cited by examiner

*Primary Examiner*—Duc Truong
(74) *Attorney, Agent, or Firm*—Sughrue Mion, PLLC

(57) ABSTRACT

The present invention relates to a polymer film comprising a polymer having liquid crystallinity, having a number-average molecular weight in terms of polystyrene of $10^3$ to $10^8$ and having an electron mobility or hole mobility of $10^{-5}$ cm$^2$/Vs or more, and having a film thickness in the range from 1 nm to 100 μm. This polymer film can be used for various polymer film devices such as an organic transistor, organic solar battery, optical sensor, electrophotographic photoreceptor, spatial light modulator, photorefractive device and the like.

2 Claims, 4 Drawing Sheets

POLYMER FILM AND POLYMER FILM DEVICE USING SAME

FIELD OF THE INVENTION

The present invention relates to a polymer film and a polymer film device using the polymer film.

BACKGROUND TECHNOLOGY

Films containing an organic material having an electron transporting property and a hole transporting property provide an expectation of application to a film device such as an organic solar battery and the like, and variously investigated.

As such films, films are studied composed of a polymer compound having in its main chain a molecule structure having an electron transporting property or a hole transporting property, and examples thereof include polymer films made of polyphenylene vinylene derivatives, polyfluorene derivatives, polyphenylene derivatives, polythiophene derivatives and the like.

DISCLOSURE OF THE INVENTION

An object of the present invention is to provide a novel polymer film useful as a film for a film device such as an organic transistor, organic solar battery and the like.

The present inventors have intensively studied for attaining the above-mentioned object, and resultantly found a polymer film useful as a film for a film device, completing the present invention. Namely, the present invention relates to a polymer film comprising a polymer having liquid crystallinity, having a number-average molecular weight in terms of polystyrene of $10^3$ to $10^8$ and having an electron mobility or hole mobility of $10^{-5}$ cm$^2$/Vs or more, and having a film thickness in the range from 1 nm to 100 μm.

BEST MODE FOR CARRYING OUT THE INVENTION

Figure 1:
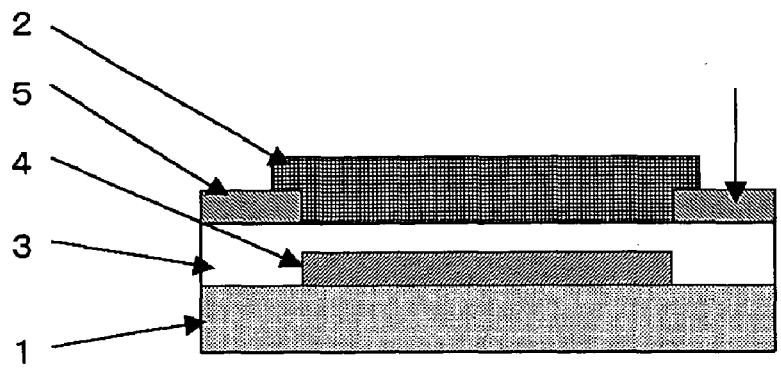
FIG. 1 shows a schematic sectional view of a reverse stagger type organic transistor according to the present invention.

The polymer used in a polymer film of the present invention is required to have liquid crystallinity. Here, to have liquid crystallinity means that a polymer shows a liquid crystal phase, and those having liquid crystallinity at a temperature of 100° C. or more are preferable. Showing liquid crystallinity can be confirmed by observation with a polarized microscope, differential scanning calorimetry, X-ray diffraction measurement and the like.

The number-average molecular weight in terms of polystyrene of a polymer used in a polymer film of the present invention is from $10^3$ to $10^8$, preferably from $10^4$ to $10^6$.

This polymer has an electron mobility or hole mobility of $10^{-5}$ cm$^2$/Vs or more, further preferably $10^{-4}$ cm$^2$/Vs or more. The electron mobility and the hole mobility can be measured by a time of flight method, electric field effect transistor method and the like.

Of polymers used in the present invention, polymers having in its main chain a 5-membered ring structure containing a hetero atom are preferable, and more preferable are those containing a repeating unit of the following formula (1-1), (1-2), (1-3), (1-4) or (1-5) (hereinafter, referred to as hetero atom-condensed ring unit, in some cases).

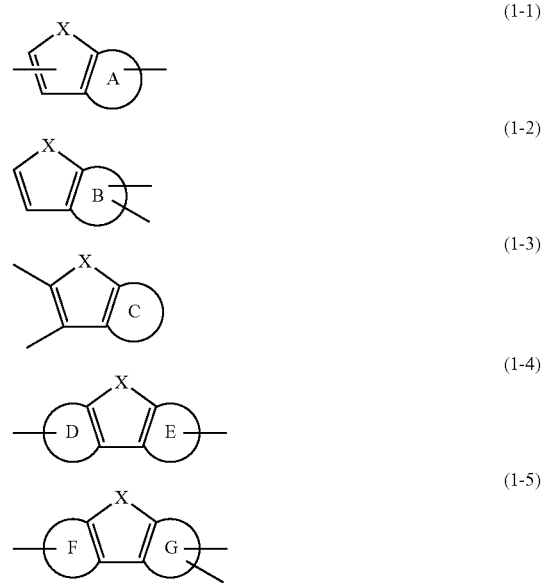

In the formulae, X represents a hetero atom or a divalent group containing hetero atoms.

In the divalent group containing hetero atoms, one hetero atom contained in the group is required to be contained in a 5-membered ring adjacent to A to G rings of the repeating units.

Here, the hetero atom means an atom other than carbon having sufficiently stable covalent valency of at least two, and includes oxygen, sulfur, nitrogen, phosphorus, boron and the like.

As X, preferable are S, O as a hetero atom and SiRR' as a divalent group containing hetero atoms, and more preferable is S.

R and R' in SiRR' each independently represent a hydrogen atom, halogen atom, hydroxyl group, alkyl group, alkoxy group, alkylthio group, aryl group, aryloxy group, arylthio group, arylalkyl group, arylalkoxy group, arylalkylthio group, substituted amino group, or monovalent heterocyclic group.

A ring, B ring, C ring, D ring, E ring, F ring and G ring each independently represent an aromatic ring. As the aromatic ring, exemplified are: aromatic hydrocarbon ring, such as benzene ring, naphthalene ring, anthracene ring, tetracene ring, pentacene ring, pyrene ring, phenanthrene ring, etc.; and hetero atom aromatic ring, such as pyridine ring, bipyridine ring, phenanthroline ring, quinoline ring, isoquinoline ring, thiophen ring, furan ring, pyrrole ring, etc.

The aromatic ring may have a substituent selected from a group consisting of alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imino group, amide group, imide group, monovalent heterocyclic group, carboxyl group, substituted carboxyl group, and cyano group. When a plurality of the substituents exist, they may be the same or different.

The alkyl group in the above substituent may be any of linear, branched, or cyclic, and usually has about 1 to 20 carbon atoms. Examples thereof include methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group, etc., and pentyl group, hexyl group, octyl group, 2-ethylhexyl group, decyl group, and 3,7-dimethyloctyl group are preferable.

The alkoxy group may be any of linear, branched, or cyclic, and usually has about 1 to 20 carbon atoms. Examples thereof include methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group, etc., and pentyloxy group, hexyloxy group, octyloxy group, 2-ethylhexyloxy group, decyloxy group, 3,7-dimethyloctyloxy group are preferable.

The alkylthio group may be any of linear, branched, or cyclic, and usually has about 1 to 20 carbon atoms. Examples thereof include methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group, etc., and pentylthio group, hexylthio group, octylthio group, 2-ethylhexylthio group, decylthio group, 3,7-dimethyloctylthio group are preferable.

The aryl group usually has about 6 to 60 carbon atoms. Examples thereof include phenyl group, $C_1$-$C_{12}$ alkoxyphenyl group ($C_1$-$C_{12}$ means the number of carbon atoms of 1 to 12. Hereinafter, means the same), $C_1$-$C_{12}$ alkylphenyl group, 1-naphtyl group, 2-naphtyl group, 1-anthracenyl group, 2-anthracenyl group, 9-anthracenyl group, pentafluorophenyl group, and $C_1$-$C_{12}$ alkoxyphenyl group, and $C_1$-$C_{12}$ alkylphenyl group are preferable. Here, the aryl group means a group in which one hydrogen atom is removed from an aromatic hydrocarbon. The aromatic hydrocarbon includes those containing a condensed ring, and those containing two or more independent benzene rings or condensed rings bonded directly or through a group such as a vinylene group or the like.

Specific examples of $C_1$-$C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, etc.

Specific examples of $C_1$-$C_{12}$ alkylphenyl group include methylphenyl group, ethylphenyl group, dimethylphenyl group, propylphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decylphenyl group, dodecylphenyl group, etc.

The aryloxy group has usually about 6-60 carbon atoms, and specific examples thereof include phenoxy group, $C_1$-$C_{12}$ alkoxyphenoxy group, $C_1$-$C_{12}$ alkylphenoxy group, 1-naphtyloxy group, 2-naphtyloxy group, pentafluorophenyloxy group, etc., and $C_1$-$C_{12}$ alkoxyphenoxy group, and $C_1$-$C_{12}$ alkylphenoxy group are preferable.

Specific examples of $C_1$-$C_{12}$ alkoxy include methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, etc. Specific examples of $C_1$-$C_{12}$ alkylphenoxy group include methylphenoxy group, ethylphenoxy group, dimethylphenoxy group, propylphenoxy group, 1,3,5-trimethylphenoxy group, methylethylphenoxy group, i-propylphenoxy group, butylphenoxy group, i-butylphenoxy group, t-butylphenoxy group, pentylphenoxy group, isoamylphenoxy group, hexylphenoxy group, heptylphenoxy group, octylphenoxy group, nonylphenoxy group, decylphenoxy group, dodecylphenoxy group, etc.

The arylthio group has usually about 3-60 carbon atoms, and specific examples thereof include phenylthio group, $C_1$-$C_{12}$ alkoxyphenylthio group, $C_1$-$C_{12}$ alkylphenylthio group, 1-naphthylthio group, 2-naphthylthio group, pentafluorophenylthio group, etc., and $C_1$-$C_{12}$ alkoxyphenylthio group, and $C_1$-$C_{12}$ alkylphenylthio group are preferable.

The arylalkyl group has usually about 7-60 carbon atoms, and specific examples thereof include phenyl-$C_1$-$C_{12}$ alkyl group, $C_1$-$C_{12}$ alkoxyphenyl-$C_1$-$C_{12}$ alkyl group, $C_1$-$C_{12}$ alkylphenyl-$C_1$-$C_{12}$ alkyl group, 1-naphtyl-$C_1$-$C_{12}$ alkyl group, 2-naphtyl-$C_1$-$C_{12}$ alkyl group, etc., and $C_1$-$C_{12}$ alkoxyphenyl-$C_1$-$C_{12}$ alkyl group, and $C_1$-$C_{12}$ alkylphenyl-$C_1$-$C_{12}$ alkyl group are preferable.

The arylalkoxy group has usually about 7-70 carbon atoms, and specific examples thereof include: phenyl-$C_1$-$C_{12}$ alkoxy groups, suc as phenylmethoxy group, phenylethoxy group, phenylbutoxy group, phenylpentyloxy group, phenylhexyloxy group, phenylheptyloxy group, phenyloctyloxy group, etc.; $C_1$-$C_{12}$ alkoxyphenyl-$C_1$-$C_{12}$ alkoxy group, $C_1$-$C_{12}$ alkylphenyl-$C_1$-$C_{12}$ alkoxy group, 1-naphtyl-$C_1$-$C_{12}$ alkoxy group, 2-naphtyl-$C_1$-$C_{12}$ alkoxy group, etc.; and $C_1$-$C_{12}$ alkoxyphenyl-$C_1$-$C_{12}$ alkoxy group, and $C_1$-$C_{12}$ alkylphenyl-$C_1$-$C_{12}$ alkoxy group are preferable.

The arylalkylthio group has usually about 7-60 carbon atoms, and specific examples thereof include phenyl-$C_1$-$C_{12}$ alkylthio group, $C_1$-$C_{12}$ alkoxyphenyl-$C_1$-$C_{12}$ alkylthio group, $C_1$-$C_{12}$ alkylphenyl-$C_1$-$C_{12}$ alkylthio group, 1-naphtyl-$C_1$-$C_{12}$ alkylthio group, 2-naphtyl-$C_1$-$C_{12}$ alkylthio group, etc., and $C_1$-$C_{12}$ alkoxyphenyl-$C_1$-$C_{12}$ alkylthio group, and $C_1$-$C_{12}$ alkylphenyl-$C_1$-$C_{12}$ alkylthio group are preferable.

The arylalkenyl group has usually about 7-60 carbon atoms, and specific examples thereof include phenyl-$C_2$-$C_{12}$ alkenyl group, $C_1$-$C_{12}$ alkoxyphenyl-$C_2$-$C_{12}$ alkenyl group, $C_1$-$C_{12}$ alkylphenyl-$C_2$-$C_{12}$ alkenyl group, 1-naphtyl-$C_2$-$C_{12}$ alkenyl group, 2-naphtyl-$C_2$-$C_{12}$ alkenyl group, etc., and $C_1$-$C_{12}$ alkoxyphenyl-$C_2$-$C_{12}$ alkenyl group, and $C_2$-$C_{12}$ alkylphenyl-$C_1$-$C_{12}$ alkenyl group are preferable.

The arylalkynyl group has usually about 7-60 carbon atoms, and specific examples thereof include phenyl-$C_2$-$C_{12}$ alkynyl group, $C_1$-$C_{12}$ alkoxyphenyl-$C_2$-$C_{12}$ alkynyl group, $C_1$-$C_{12}$ alkylphenyl-$C_2$-$C_{12}$ alkynyl group, 1-naphtyl-$C_2$-$C_{12}$ alkynyl group, 2-naphtyl-$C_2$-$C_{12}$ alkynyl group, etc. and $C_1$-$C_{12}$ alkoxyphenyl-$C_2$-$C_{12}$ alkynyl group, and $C_1$-$C_{12}$ alkylphenyl-$C_2$-$C_{12}$ alkynyl group are preferable.

The substituted amino group means an amino group which is substituted by one or two groups selected from alkyl group, aryl group, arylalkyl group and monovalent heterocyclic group, and the substituent has usually 1 to 60 carbon atoms.

Specific examples thereof include methylamino group, dimethylamino group, ethylamino group, diethylamino group, propylamino group, dipropylamino group, i-propylamino group, diisopropylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, cyclopentylamino group, dicyclopentylamino group, cyclohexylamino group, dicyclohexylamino group, pyrrolidyl group, piperidyl group, ditrifluoromethylamino groupphenylamino group, diphenylamino group, $C_1$-$C_{12}$ alkoxyphenylamino group, di($C_1$-$C_{12}$ alkoxyphenyl)amino group, di($C_1$-$C_{12}$ alkylphenyl)amino group, 1-naphtylamino group, 2-naphtylamino group, pentafluorophenylamino group, pyridylamino group, pyridazinylamino group, pyrimidylamino group, pyrazylamino group, triazylamino group phenyl-$C_1$-$C_{12}$ alkylamino group, $C_1$-$C_{12}$ alkoxyphenyl-$C_1$-$C_{12}$ alkylamino group, $C_1$-$C_{12}$ alkylphenyl-$C_1$-$C_{12}$ alkylamino group, di($C_1$-$C_{12}$ alkoxyphenyl-$C_1$-$C_{12}$ alkyl)amino group, di($C_1$-$C_{12}$ alkylphenyl-$C_1$-$C_{12}$ alkyl) amino group, 1-naphtyl-$C_1$-$C_{12}$ alkylamino group, 2-naphtyl-$C_1$-$C_{12}$ alkylamino group, etc.

The substituted silyl group means a silyl group which is substituted by one, two or three groups selected from alkyl group, aryl group, arylalkyl group and monovalent heterocyclic group. The substituent usually has 1 to 60 carbon atoms.

Specific examples thereof include trimethylsilyl group, triethylsilyl group, tripropylsilyl group, tri-i-propylsilyl group, dimethyl-i-propylsilyl group, diethyl-i-propylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, lauryldimethylsilyl group, phenyl-$C_1$-$C_{12}$ alkylsilyl group, $C_1$-$C_{12}$ alkoxyphenyl-$C_1$-$C_{12}$ alkylsilyl group, $C_1$-$C_{12}$ alkylphenyl-$C_1$-$C_{12}$ alkylsilyl group, 1-naphtyl-$C_1$-$C_{12}$ alkylsilyl group, 2-naphtyl-$C_1$-$C_{12}$ alkylsilyl group, phenyl-$C_1$-$C_{12}$ alkyldimethylsilyl group, triphenylsilyl group, tri-p-xylylsilyl group, tribenzylsilyl group, diphenylmethylsilyl group, t-butyldiphenylsilyl group, dimethylphenylsilyl group, etc.

The acyl group has usually about 2-20 carbon atoms, and specific examples thereof include acetyl group, propionyl group, butyryl group, isobutyryl group, pivaloyl group, benzoyl group, trifluoroacetyl group, pentafluorobenzoyl group, etc.

The acyloxy group has usually about 2-20 carbon atoms, and specific examples thereof include acetoxy group, propionyloxy group, butyryloxy group, isobutyryloxy group, pivaloyloxy group, benzoyloxy group, trifluoroacetyloxy group, pentafluorobenzoyloxy group, etc.

The imino group has usually about 2-20 carbon atoms, and specific examples thereof include groups represented by the following structure.

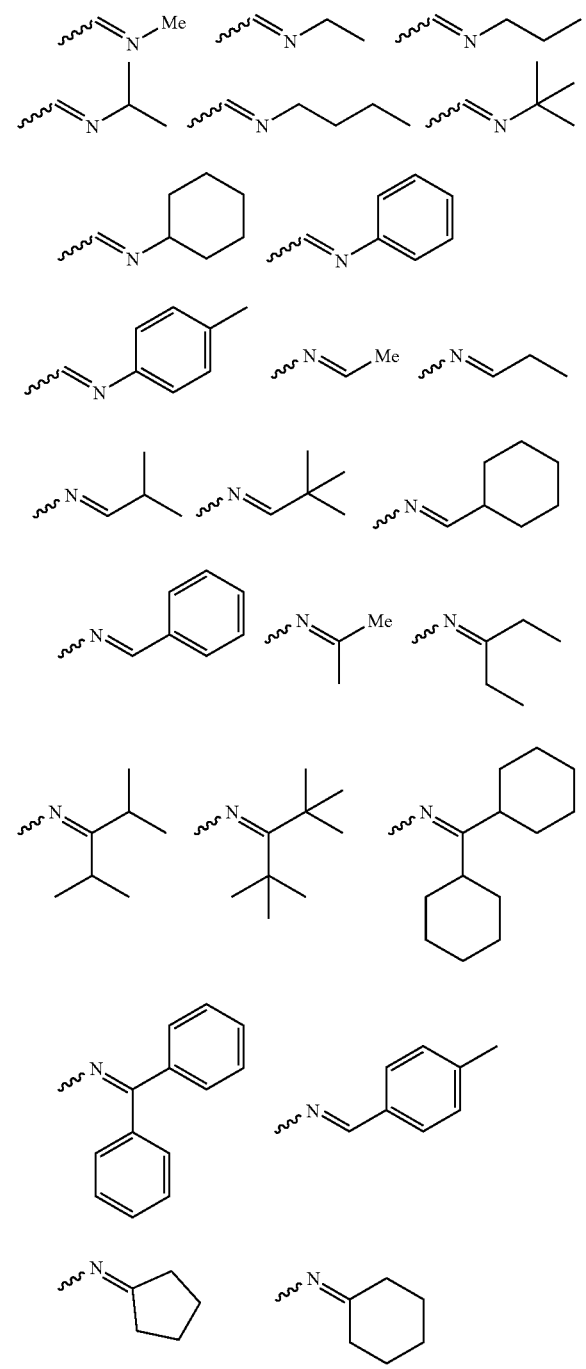

The amide group has usually about 2-20 carbon atoms, and specific examples thereof include formamide group, acetamide group, propioamide group, butyroamide group, benzamide group, trifluoroacetamide group, pentafluorobenzamide group, diformamide group, diacetoamide group, dipropioamide group, dibutyroamide group, dibenzamide group, ditrifluoroacetamide group, dipentafluorobenzamide group, etc.

The imide group has usually about 2-60 carbon atoms, and specific examples thereof include the following groups.

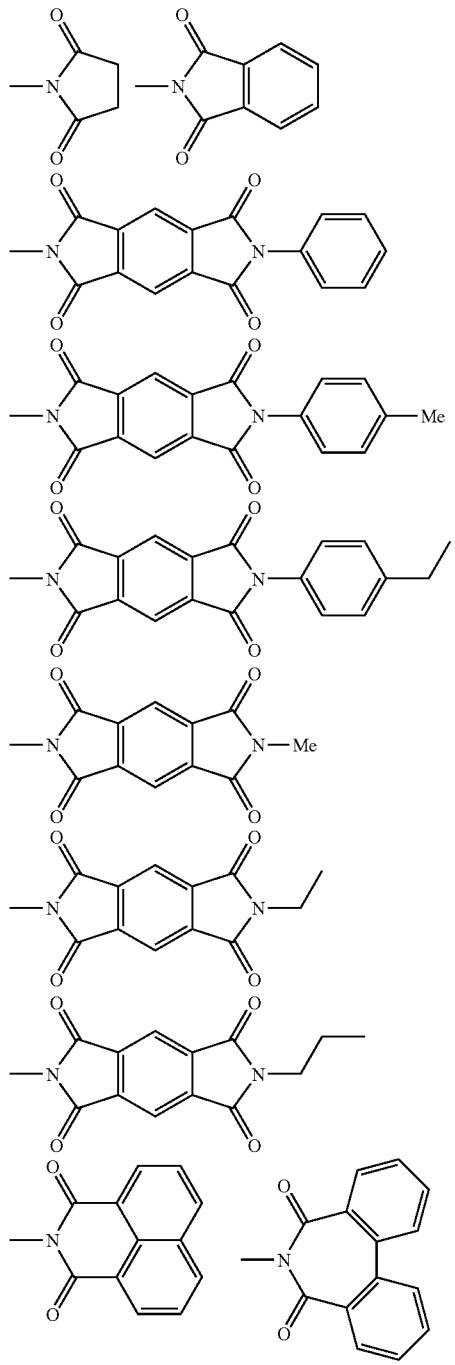

The substituted carboxyl group has usually about 2-60 carbon atoms, and means a carboxyl group substituted by alkyl group, aryl group, arylalkyl group or monovalent heterocyclic group. Examples thereof include methoxycarbonyl group, ethoxycarbonyl group, propoxycarbonyl group, i-propoxycarbonyl group, butoxycarbonyl group, i-butoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, trifluoromethoxycarbonyl group, pentafluoroethoxycarbonyl group, perfluorobutoxycarbonyl group, perfluorohexyloxycarbonyl group, perfluorooctyloxycarbonyl group, phenoxycarbonyl group, naphtoxycarbonyl group, pyridyloxycarbonyl group, etc.

The monovalent heterocyclic group means an atomic group in which one hydrogen atom is removed from a heterocyclic compound, and usually has about 4-60 carbon atoms, and preferably 4-20 carbon atoms. Here, the carbon atoms of the substituents are not counted as the carbon atoms of the heterocyclic group.

Here, the heterocyclic compound means an organic compound having a cyclic structure in which at least one heteroatom such as oxygen, sulfur, nitrogen, phosphorus, boron, arsenic, etc. is contained in the cyclic structure as the element other than carbon atoms.

Specific examples include thienyl group, $C_1$-$C_{12}$ alkylthienyl group, pyroryl group, furyl group, pyridyl group, $C_1$-$C_{12}$ alkylpyridyl group, piperidyl group, quinolyl group, isoquinolyl group, etd., and thienyl group, $C_1$-$C_{12}$ alkylthienyl group, pyridyl group, and $C_1$-$C_{12}$ alkylpyridyl group are preferable.

Examples of the halogen atoms include fluorine atom, chlorine atom, bromine atom, and iodine atoms.

R and R' in SiRR' each independently represent, as above, hydrogen atom, halogen atom, hydroxyl group, alkyl group, alkoxy group, alkylthio group, aryl group, aryloxy group, arylthio group, arylalkyl group, arylalkoxy group, arylalkylthio group, substituted amino group, and monovalent heterocyclic group. Specific examples thereof include the same groups exemplified as the substituents which may be contained in aromatic ring such as A ring, B ring, etc.

In the above substituents, and the substituents in the examples of R and R' of SiRR' containing an alkyl chain therein, they may be any one of linear, branched, cyclic, or the combination thereof. As the alkyl chain which is not linear, exemplified are isoamyl group, 2-ethylhexyl group, 3,7-dimethyloctyl group, cyclohexyl group, 4-$C_1$-$C_{12}$ alkylcyclohexyl group, etc. Ends of two alkyl chains may be connected to form a ring.

Furthermore, methyl or methylene as a part of said alkyl chain may be replaced by a group containing a hetero atom, or a methyl or methylene group which is substituted with one or more fluorine atoms. As the hetero atom, an oxygen atom, a sulfur atom, a nitrogen atom, etc. are exemplified.

In view of solubility, liquid crystal property, electron- or hole-transporting property, etc., it is preferable that hetero atom condensed ring unit has one or more of the above substituents.

Among the repeating units represented by the above formula (1-1), (1-2), (1-3), (1-4) or (1-5), (1-1) and (1-4) are preferable, and (1-4) is more preferable. Examples of the preferable repeating unit are shown below.

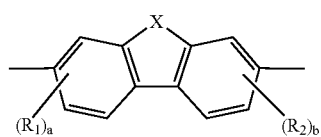

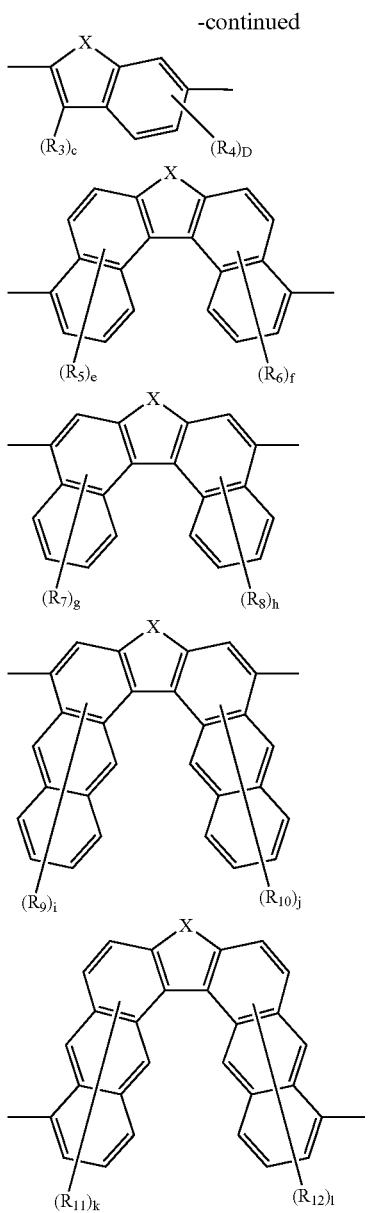

condensed ring unit is 10 mole % or more based on the whole repeating units, preferably 30 mole % or more, and more preferably 50 mole % or more.

In the polymer containing hetero atom condensed ring unit used for the present invention, said polymer can contain other repeating units than the hetero atom condensed ring unit, and among them, the below formula (3), formula (4), formula (5) and formula (6) are preferable.

$$—Ar_1— \quad (3)$$

$$-(Ar_2—X_1)_{f\!f}Ar_3— \quad (4)$$

$$—Ar_4—X_2— \quad (5)$$

$$—X_3— \quad (6)$$

In the formula, $Ar_1$, $Ar_2$, $Ar_3$ and $Ar_4$ each independently represent an arylene group, divalent heterocyclic group or divalent group having metal complex structure. $X_1$, $X_2$ and $X_3$ each independently represent $—CR_{13}=CR_{14}—$, $—C\equiv C—$, $—N(R_{15})—$, or $—(SiR_{16}R_{17})_m—$. $R_{13}$ and $R_{14}$ each independently represent hydrogen atom, alkyl group, aryl group, monovalent heterocyclic group, carboxyl group, substituted carboxyl group, or cyano group. $R_{15}$, $R_{16}$ and $R_{17}$ each independently represent hydrogen atom, alkyl group, aryl group, monovalent heterocyclic group, arylalkyl group or substituted amino group. ff represents an integer of 1-2. m represents an integer of 1-12.

In the present invention, the arylene group means an atomic group in which two hydrogens are removed from an aromatic hydrocarbon, and usually has about 6-60 carbon atoms, preferably 6-20 carbon atoms. Here, the aromatic hydrocarbon includes those containing a condensed ring, and those containing two or more independent benzene rings or condensed rings bonded directly or through a group such as a vinylene group or the like.

Examples of the arylene group include phenylene group, biphenylene group, fluorene-diyl group, triphenylene group, stilbene-diyl, distilbene-diyl, and divalent condensed ring compound such as naphthalenediyl group, anthracenylene group, phenanthrenediyl group, pyrenediyl group, etc. Among them, phenylene group, biphenylene group, fluorene-diyl group, and stilbene-diyl group are preferable.

In the present invention, the divalent heterocyclic group is an atomic group in which two hydrogen atoms are removed from a heterocyclic compound, and usually has about 3-60 carbon atoms. Here, the heterocyclic compound means an organic compound having a cyclic structure in which at least one heteroatom such as oxygen, sulfur, nitrogen, phosphorus, boron, arsenic, etc. is contained in the cyclic structure as the element other than carbon atoms.

As the divalent heterocyclic compound group, followings are exemplified.

Divalent heterocyclic group containing nitrogen as a hetero atom; pyridine-diyl group, diaza phenylene group, quinoline-diyl group, quinoxaline-diyl group, acridine-diyl group, bipyridyl-diyl group, phenanthroline-diyl group;

Groups having fluorene structure and containing silicon, nitrogen, sulfur, selenium, etc. as a hetero atom;

5 membered-ring heterocyclic groups containing silicon, nitrogen, sulfur, selenium, etc. as a hetero atom;

Condensed 5 membered-ring heterocyclic groups containing silicon, nitrogen, sulfur, selenium, etc. as a hetero atom;

Groups in which 5 membered-ring heterocyclic group containing silicon, nitrogen, sulfur, selenium, etc. as a hetero atom is connected with a phenyl group at the α position of the hetero atom to form a dimer or oligomer;

In the formula, $R_1$, $R_2$, $R_3$, $R_4$, $R_5$, $R_6$, $R_7$, $R_8$, $R_9$, $R_{10}$, $R_{11}$ and $R_{12}$ each independently represent alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atoms, acyl group, acyloxy group, imino group, amide group, imide group, monovalent heterocyclic group, carboxyl group, substituted carboxyl group, or cyano group. a and b each independently represent an integer of 0-3. c represents 0 or 1. d represents an integer of 0-3. e, f, g and h each independently represent an integer of 0-5. i, j, k and l each independently represent an integer of 0-7. When each of a, b, d, e, f, g, h, i, j, k and l is two or more, the plurality of substituents represented by $R_1$ to $R_{12}$ may be the same or different. And preferably, each of a+b, c+d, e+f, g+h, i+j, and k+l is two or more.

In the polymer containing hetero atom condensed ring unit used for the present invention, the amount of hetero atom Groups in which 5 membered-ring heterocyclic group containing silicon, nitrogen, sulfur, selenium, etc. as a hetero atom is connected with a phenyl group at the a position of the hetero atom;

Groups in which 5 membered-ring heterocyclic group containing oxygen, nitrogen, sulfur, etc. as a hetero atom is connected with a furyl group, or thienyl group.

In the present invention, the divalent group having metal complex structure is a divalent group in which two hydrogen atoms are removed from an organic ligand of the metal having organic ligand. The organic ligand usually has about 4-60 carbon atoms, and examples thereof include: 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof, porphyrin and derivatives thereof, etc.

Examples of the central metal of the complex include aluminum, zinc, beryllium, iridium, platinum, gold, europium, terbium, etc. Examples of the metal complex having organic ligand include low molecular weight fluorescent materials, known metal complex as phosphorescent materials, triplet light-emitting complexes, etc.

The polymer used for the polymer film of the present invention may contain other repeating unit other than hetero atom condensed ring unit and repeating units represented by formulae (3)-(6) in an amount of not deteriorating the electron- and hole-transporting properties.

These repeating units and other repeating units may be bonded through non-conjugated unit, and in the repeating units, the non-conjugated unit part may be contained.

Examples of the connecting structure include the followings, and the combination of two or more thereof, etc. Here, R shows the same group with $R_1$ to $R_{12}$, and Ar represents an aromatic hydrocarbon group having 6-60 carbon atoms.

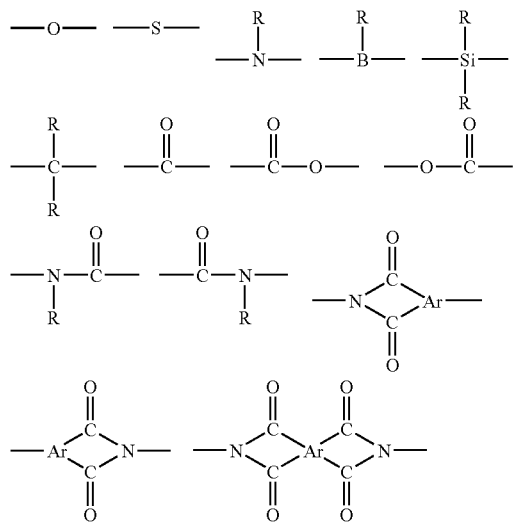

The polymer used for the polymer film of the present invention may also be a random, block or graft copolymer, or a polymer having an intermediate structure thereof, for example, a random copolymer having block property. From the viewpoint for obtaining a polymeric fluorescent substance having high fluorescent quantum yield, random copolymers having block property and block or graft copolymers are more preferable than complete random copolymers. Further, the polymer may have a branched main chain and more than three terminals. Moreover, the polymer compound may be a dendrimer.

Furthermore, the end group of polymer used for the polymer film of the present invention may also be protected with a stable group since if a polymerization active group remains intact, there is a possibility of reduction in light emitting property and life-time when made into a device. Those having a conjugated bond continuing to a conjugated structure of the main chain are preferable, and there are exemplified structures connected to an aryl group or heterocyclic compound group via a carbon-carbon bond (JP 9-45478A).

The polymer film of the present invention may be that containing one of the above-mentioned polymers or that containing two or more of the above-mentioned polymers. For enhancing an electron or hole transporting property of the polymer film, a lower molecular weight compound or polymer compound having an electron or hole transporting property can also be mixed in addition to the above-mentioned polymers. As the hole transporting material, known materials can be used, and examples thereof include pyrazoline derivatives, arylamine derivatives, stilbene derivatives, triphenyl-diamine derivatives, polyvinylcarbazole or its derivatives, polysilane or its derivatives, polysiloxane derivatives having an aromatic amine at a side chain or main chain, polyaniline or its derivatives, polythiophene or its derivatives, polypyrrole or its derivatives, polyphenylenevinylene or its derivatives, polythienylenevinylene or its derivatives, and the like, and as the electron transporting material, known materials can be used, and examples thereof include oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorenone derivatives, diphenyldicyanoethylene or its derivatives, diphenoquinone derivatives, or metal complexes of 8-hydroxyquinoline or its derivatives, polyquinoline or its derivatives, polyquinoxaline or its derivatives, polyfluorene or its derivatives, and the like.

Further, the polymer film of the present invention may contain a charge generating material for generating charge by light absorbed in the polymer film. As the charge generating material, known materials can be used, and examples thereof include azo compounds and its derivatives, diazo compounds and its derivatives, non-metal phthalocyanine compound and its derivatives, metal phthalocyanine compounds and derivatives thereof, perylene compounds and derivatives thereof, polycyclic quinone-based compounds and derivatives thereof, squalirium compounds and derivatives thereof, azulenium compounds and derivatives thereof, thiapyrylium compounds and derivatives thereof, fullerenes such as C60 and the like and derivatives thereof.

Furthermore, the polymer film may contain a material necessary for manifesting various functions. Examples thereof include materials showing a second order or third order non-linear optical effect for obtaining a photorefractive effect, sensitizers for sensitizing a function for generating charge by light absorbed, stabilizers for increasing stability, UV absorbers for absorbing UV light, and the like.

The polymer film of the present invention may contain as a polymer binder a polymer material other than the above-mentioned polymers for enhancing a mechanical property. As the polymer binder, those not extremely disturbing an electron or hole transporting property are preferable, and those showing not strong absorption for visible light are preferably used. Examples of the polymer binder include poly(N-vinylcarbazole), polyaniline or its derivatives, polythiophene or its derivatives, poly(p-phenylenevinylene) or its derivatives, poly(2,5-thienylenevinylene) or its derivatives, polycarbonate, polyacrylate, polymethyl acrylate, polymethyl methacrylate, polystyrene, polyvinyl chloride, polysiloxane and the like.

The thickness of the polymer film of the present invention is in the range of 1 nm to 100 μm, preferably in the range of 2 nm to 500 nm, further preferably in the range of 5 nm to 200 nm.

The method of producing a polymer film of the present invention is not particularly restricted, and for example, a method of forming a film from a solution containing the above-mentioned polymer, an electron or hole transporting material to be mixed if necessary, and polymer binder is exemplified.

A solvent used for film formation from a solution is not particularly restricted providing it can dissolve the above-mentioned polymer and electron or hole transporting material to be mixed, and polymer binder.

As a good solvent for a polymer used for the polymer film of the present invention, exemplified are chlorine-based solvents such as chloroform, methylene chloride, dichloroethane and the like, ether-based solvents such as tetrahydrofuran and the like, aromatic hydrocarbon-based solvents such as toluene, xylene, mesitylene, tetralin, decalin, n-butylbenzene and the like. A polymer compound is usually dissolved in an amount of 0.1 wt % or more in these solvents though the amount depends on the structure and molecular weight of a polymer compound.

As the film formation method from a solution, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like, and preferable are a spin coat method, flexo printing method and inkjet printing method.

The process for producing a polymer film of the present invention may contain a process of orienting a polymer.

In a polymer film containing a polymer oriented by this process, main chain molecules or side chain molecules are arranged along one direction, there is a tendency of improvement in the electron or hole mobility.

As the method of orienting a polymer, there can be used those known as a liquid crystal orienting method, for example, methods described in "Basic and application of liquid crystal (ekisho no kiso to oyo)" (Shoichi Matsumoto, Ichiyoshi Kakuta, joint, Kogyo Chosakai, 1991) chapter 5, "Structure and physical property of ferroelectric liquid crystal (kyoyudensei ekisho nokozo tobussei)" (Atsuo Fukuda, Hideo Takezoe, joint, Corona, 1990) chapter 7, "Liquid crystal (ekisho)", vol. 3, no. 1, (1999) pp. 3 to 16, and the like. Of them, a rubbing method, light orientation method, shearing method (dislocation stress applying method) and lifting application method are simple, useful and easily utilized as an orientation method and, preferable are a rubbing method and shearing method. The rubbing method is a method of softly rubbing the surface of a substrate with cloth and the like. As the substrate, there can be used glass, polymer films and the like. As the cloth for rubbing a substrate, cloth such as gauze, polyester, cotton, nylon, rayon and the like can be used. When an orientation film is separately formed on a substrate, an orientation ability increases further. As the orientation film, there are listed polyimide, polyamide, polyvinyl alcohol, polyester, nylon and the like, and commercially available orientation films for liquid crystal can be used. The orientation film can be formed by a spin coat method, flexo printing method and the like. The cloth used for rubbing can be appropriately selected corresponding to the orientation film used. The light orientation method is a method of forming an orientation film on a substrate and irradiating the film with polarization UV light or UV light from inclined direction, to give an orientation function. As the orientation film, there are listed polyimide, polyamide, polyvinyl cinnamate and the like, and commercially available orientation films for liquid crystal can also be used. In the rubbing method or light orientation method, orientation can be made by sandwiching a polymer material oriented between substrate subjected to the above-mentioned treatment. In this case, it is necessary to set a substrate at a temperature under which a material shows a liquid crystal phase or isotropic phase. Temperature setting may be conducted before sandwiching a polymer material between substrates or after sandwiching. The polymer material may only be applied on a substrate subjected to an orientation treatment. Application of a polymer can be conducted by a method in which a polymer is placed on a substrate and set at a temperature of Tg or more or a temperature under which a liquid crystal phase or isotropic phase is shown, and coated along one direction by a rod and the like, or a solution dissolved in an organic solvent is prepared, and the solution is applied by a spin coat method, flexo printing method and the like. The shearing method is a method in which on a polymer material placed on a substrate, another substrate is placed, and the upper substrate is dislocated toward one direction at a temperature under which a liquid crystal phase or isotropic phase is shown. In this case, if a substrate subjected to the orientation treatment as described in the above-mentioned rubbing method or light orientation method is used, that having higher degree of orientation can be obtained. As the substrate, glass and polymer films and the like can be used, and that which is dislocated by stress may not be a substrate but be a metal rod or the like. The lifting application method is a method in which a substrate is immersed in a polymer solution and lifted. The organic solvent used in a polymer solution and the speed of lifting a substrate are not particularly restricted, and can be selected and controlled, corresponding to the degree of orientation of a polymer. The polymer orientation process is sometimes conducted after a process of making a film from a polymer like the rubbing method and shearing method, and sometimes conducted simultaneously with a process of making a film from a polymer like the lifting application. A process of making an orientation film may be contained before a process of making a film from a polymer.

The polymer film of the present invention has an electron or hole transporting property, therefore, it can be used for various polymer film devices such as an organic transistor, organic solar battery, optical sensor, electrophotographic photoreceptor, spatial light modulator, photorefractive device and the like, by controlling transportation of electrons or holes injected from an electrode, or charges generated by light absorption. When the polymer film is used in these polymer film devices, it is preferable to orient the polymer film by an orientation treatment since then an electron or hole transporting property is improved.

Figure 2:
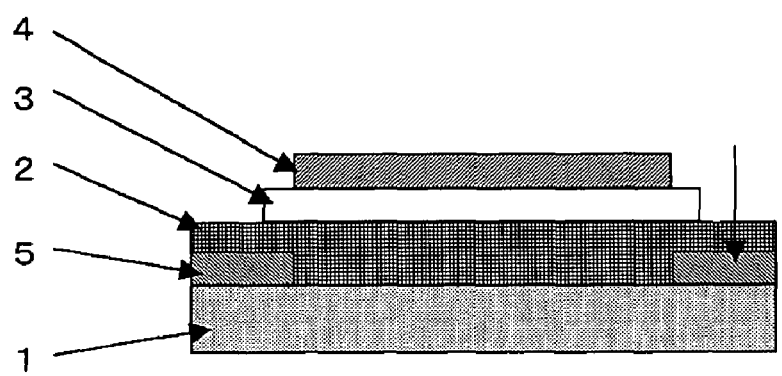
FIG. 2 shows a schematic sectional view of a forward stagger type organic transistor according to the present invention.

FIGS. 1 and 2 are drawings illustrating application of the polymer film of the present invention to an organic transistor, as a typical example. Adjacent to a polymer film (2), a source electrode (5) and drain electrode (6) are formed, further, a gate electrode (4) is placed between both the electrodes via an insulator film (3). The electrode material may be a material having high conductivity, and metals such as aluminum, gold, silver, copper and the like can be used. The insulator film may be a material showing high electric insulation property, and for example, $SiO_x$, $SiN_x$, polyimides and the like can be used.

As the substrate material (1), silicon substrates, glass substrates, plastic substrates and the like can be used.

Figure 3:
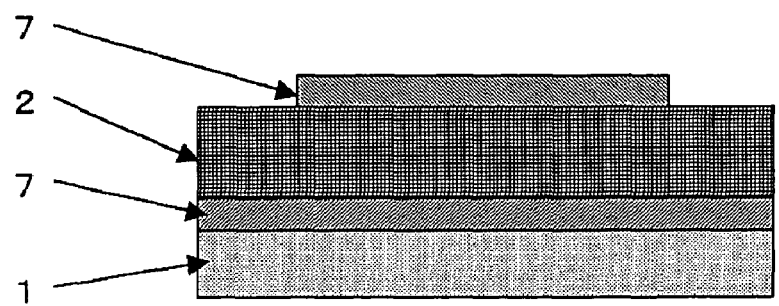
FIG. 3 shows a schematic sectional view of a solar battery according to the present invention.

FIG. 3 is a view illustrating application of the polymer film of the present invention to a solar battery, as a typical example. A polymer film (2) is placed between a pair of electrodes (7) one of which is transparent or semi-transparent. As the electrode material, metals such as aluminum, gold, silver, copper, alkali metals, alkaline earth metals and the like, or semi-transparent films, transparent conductive films made of them, can be used. For obtaining high open-circuit voltage, it is preferable to select electrodes so that a difference in work function is large. In the polymer film, a carrier generation agent, sensitizer and the like can be added to enhance photosensitivity. As the substrate material (1), silicon substrates, glass substrates, plastic substrates and the like can be used.

Figure 4:
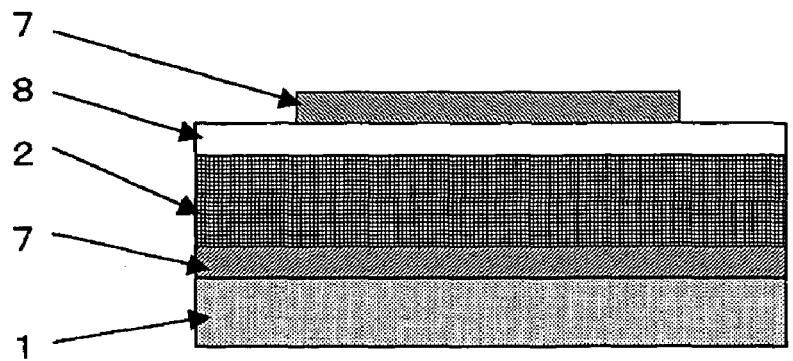
FIG. 4 shows a schematic sectional view of a layered type optical sensor according to the present invention.
Figure 5:
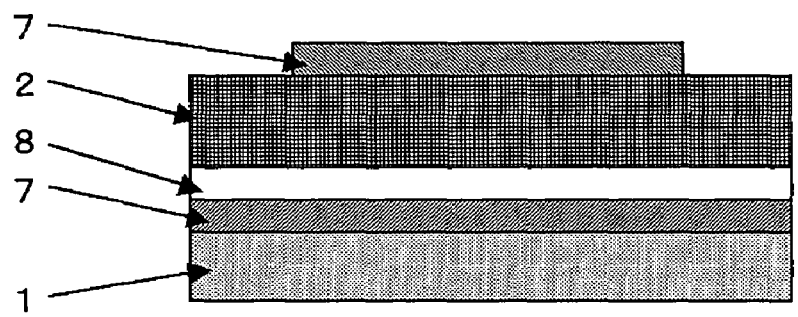
FIG. 5 shows a schematic sectional view of a layered type optical sensor according to the present invention.
Figure 6:
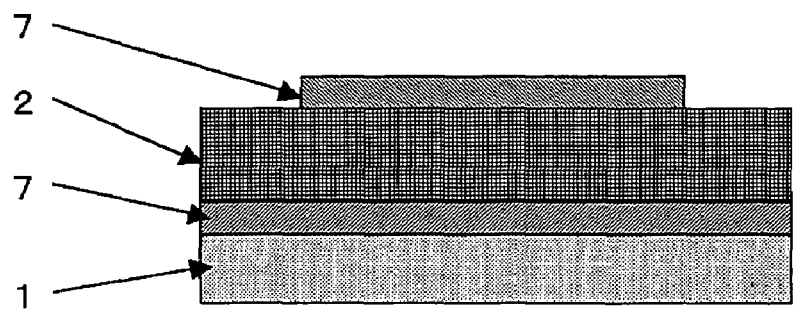
FIG. 6 shows a schematic sectional view of a single-layer type optical sensor according to the present invention.

FIGS. 4 to 6 are views illustrating application of the polymer film of the present invention to an optical sensor, as a typical example. A polymer film (2) is placed between a pair of electrodes (7) one of which is transparent or semi-transparent. A charge generating layer (8) absorbing light to generate charge can also be inserted. As the electrode material, metals such as aluminum, gold, silver, copper, alkali metals, alkaline earth metals and the like, or semi-transparent films, transparent conductive films made of them, can be used. For enhancing photosensitivity, a carrier generation agent, sensitizer and the like can be added into a polymer film. As the substrate material (1), silicon substrates, glass substrates, plastic substrates and the like can be used.

Figure 7:
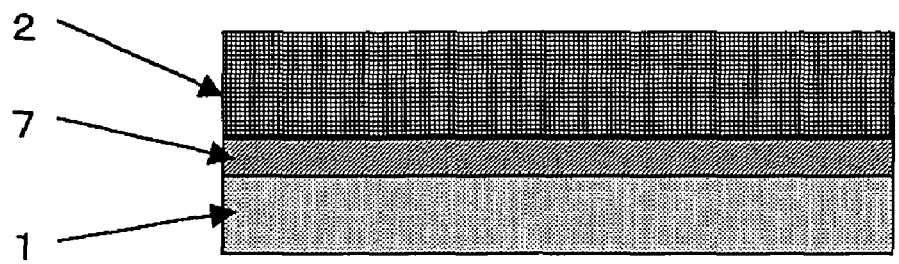
FIG. 7 shows a schematic sectional view of a single-layer type electrophotographic photoreceptor according to the present invention.
Figure 8:
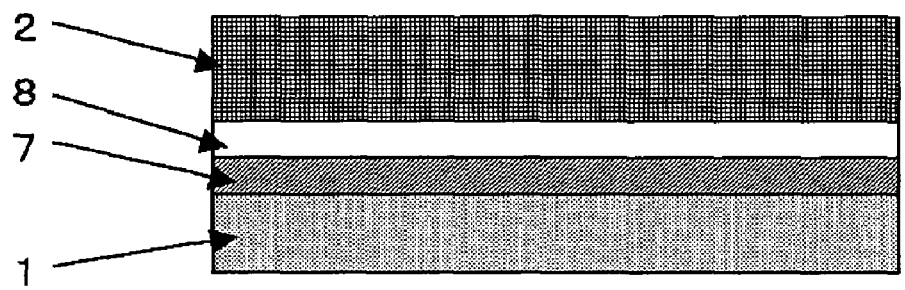
FIG. 8 shows a schematic sectional view of a layered type electrophotographic photoreceptor according to the present invention.
Figure 9:
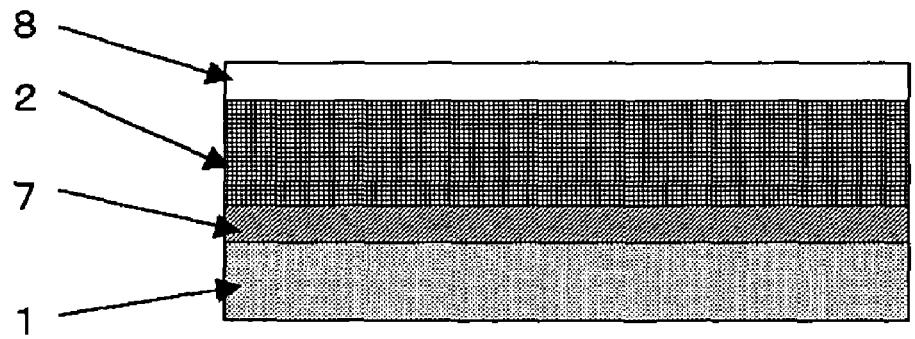
FIG. 9 shows a schematic sectional view of a layered type electrophotographic photoreceptor according to the present invention.

FIGS. 7 to 9 are views illustrating application of the polymer film of the present invention to an electrophotographic photoreceptor, as a typical example. A polymer film (2) is placed on an electrode (7). A charge generating layer (8) absorbing light to generate charge can also be inserted. As the electrode material, metals such as aluminum, gold, silver, copper and the like can be used. For enhancing photosensitivity, a carrier generation agent, sensitizer and the like can be added into a polymer film. As the substrate material, silicon substrates, glass substrates, plastic substrates and the like can be used. A metal such as aluminum and the like can also be used as a substrate material and as an electrode simultaneously.

Figure 10:
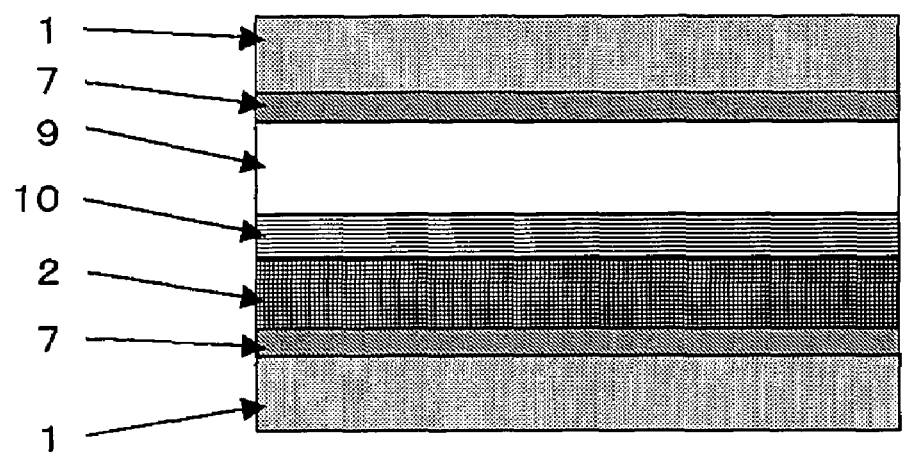
FIG. 10 shows a schematic sectional view of a spatial light modulator according to the present invention.

FIG. 10 is a view illustrating application of the polymer film of the present invention to a spatial light modulator, as a typical example. A polymer film (2), dielectric mirror layer (10) and liquid crystal layer (9) are placed between a pair of transparent or semi-transparent electrodes (7). The dielectric mirror layer is preferably composed of a multi-layer film made of a dielectric substance, and is so designed that it has a wavelength region of low reflectance and a wavelength region of high reflectance, and its boundary rises steeply. For the liquid crystal layer, various liquid crystal materials can be used, and it is preferable to use ferroelectric liquid crystals. As the electrode material, semi-transparent films, transparent conductive films made aluminum, gold, silver, copper and the like having high conductivity can be used. As the substrate material, transparent or semi-transparent materials such as glass substrates, plastic substrate and the like can be used.

Figure 11:
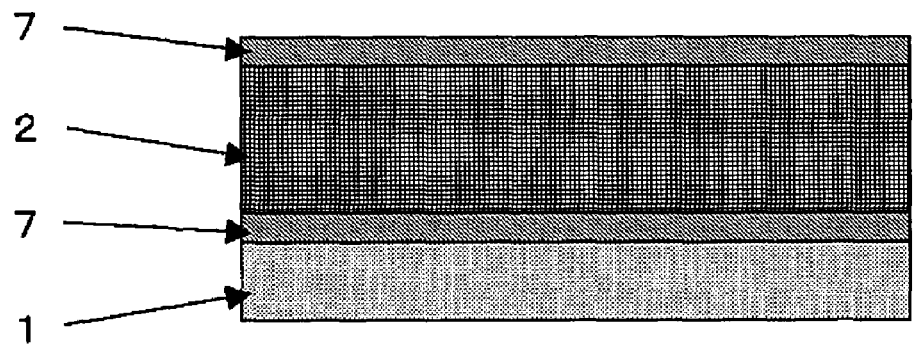
FIG. 11 shows a schematic sectional view of a photorefractive device according to the present invention.

FIG. 11 is a view illustrating application of the polymer film of the present invention to a photorefractive device, as a typical example. A polymer film (2) is placed between a pair of transparent or semi-transparent electrodes (7). In the polymer film, a second order or third order non-linear optical material showing a non-linear optical effect can be mixed, and a carrier generating agent, sensitizer and the like can be added to enhance photosensitivity. As the electrode material, semi-transparent films, transparent conductive films made aluminum, gold, silver, copper and the like having high conductivity can be used. As the substrate material, transparent or semi-transparent materials such as glass substrates, plastic substrate and the like can be used.

The following examples will illustrate the present invention further in detail, but the scope of the invention is not limited to them.

Here, the number-average molecular weight in terms of polystyrene was measured by gel permeation chromatography (GPC) using chloroform as a solvent.

REFERENCE EXAMPLE 1

Into 1 L four-necked flask, under an inert atmosphere, was charged 7 g of 2,8-dibromodibenzothiophene and 280 ml of THF, and they were stirred at room temperature to be dissolved, then, cooled down to $-78°$ C. 29 ml of n-butyllithium (1.6 mol hexane solution) was dropped on this. After completion of dropping, the solution was stirred for 2 hours while maintaining the temperature, and 13 g of trimethoxyboronic acid was dropped. After completion of dropping, the mixture was returned slowly to room temperature. The mixture was stirred at room temperature for 3 hours, and disappearance of raw material was confirmed by TLC. 100 ml of 5% sulfuric acid was added to complete the reaction, and the mixture was stirred at room temperature for 12 hours. The resulted solution was washed with water added, and the organic layer was extracted. The solvent was substituted by ethyl acetate, then, 5 ml of 30% hydrogen peroxide water was added, and the mixture was stirred at $40°$ C. for 5 hours. Thereafter, the organic layer was extracted, and the residue was washed with a 10% ammonium iron(II) sulfate aqueous solution and dried, then, the solvent was removed, to obtain 4.43 g of brown solid. This is referred to as compound A.

Into a 200 ml three-necked flask, under an inert atmosphere, was charged 4.43 g of compound A, 25.1 g of n-octyl bromide and 12.5 g (23.5 mmol) of potassium carbonate, and 50 ml of methyl isobutyl ketone as a solvent was added, and the mixture was refluxed under heat at $125°$ C. for 6 hours. After completion of the reaction, the solvent was removed, and the residue was separated between chloroform and water, and the organic layer was extracted, further, the residue was washed with water twice. After drying over anhydrous sodium sulfate, purification was performed by a silica gel column (developing solvent: toluene/cyclohexane=1/10), to obtain 8.49 g of compound B.

Into a 100 ml three-necked flask was charged 6.67 g of compound B and 40 ml of acetic acid, and the mixture was heated up to a bath temperature of $140°$ C. in an oil bath. Subsequently, 13 ml of 30% hydrogen peroxide water was added from a cooling tube and the mixture was stirred vigorously for 1 hour, then, 180 ml of cold water was poured to complete the reaction. The reaction solution was extracted with chloroform and dried, then, the solvent was removed to obtain 6.96 g of compound C.

Into a 200 ml four-necked flask, under an inert atmosphere, was charged 3.96 g of compound C and 15 ml of a acetic acid/chloroform mixture (=1:1), and the mixture was stirred at $70°$ C. for dissolution thereof. Subsequently, 6.02 g of bromine was dissolved in 3 ml of the above-mentioned solvent and added, and the mixture was stirred for 3 hours. A sodium thiosulfate aqueous solution was added to this to remove unreacted bromine, and the remaining solution was partitioned between chloroform and water, and the organic layer was extracted and dried. The solvent was removed, and the residue was purified on silica gel column (developing solvent: chloroform/hexane=1/4) to obtain 4.46 g of compound D.

Into a 200 ml three-necked flask, under an inert atmosphere, was charged 3.9 g of compound D and 50 ml of diethyl ether, and the mixture was heated up to 40° C. and stirred. 1.17 g of lithium aluminum hydride was added portion-wise, and reacted for 5 hours. By adding water portion-wise, excess lithium aluminum hydride was decomposed, and washed with 5.7 ml of 36% hydrochloric acid. The solution was partitioned between chloroform and water, and the organic layer was extracted, then, dried. The dried substance was purified on silica gel column (developing solvent: chloroform/hexane=1/5) to obtain 1.8 g of compound E.

Polymer 1 was sandwiched between two glass substrates subjected to an orientation treatment, then, set in a temperature control apparatus. This was heated from room temperature while observing by a polarization microscope, consequently, a liquid crystal phase was shown around 190%. When the sample was rotated under cross nicol, the observed image showed light and dark change, confirming orientation of the liquid crystal. The orientation treatment of the substrate was conducted by applying an orientation film SE5291 manufactured by Nissan Chemical Industries, Ltd. on a washed Compound E

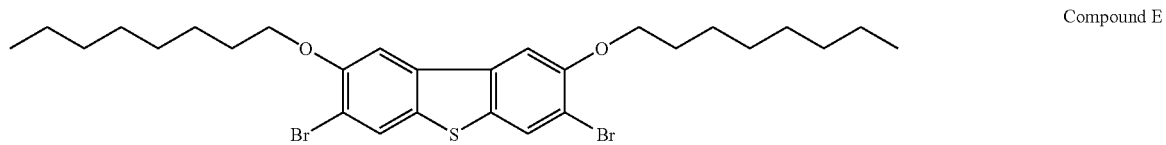

Compound F was synthesized containing an i-pentyloxy group instead of an n-octyloxy group in compound E. 13.8 g of compound F was obtained using the same synthesis method as for compound E except that i-pentyl bromide was used instead of n-octyl bromide in the synthesis of compound B.

glass substrate by spin coating, and baking this, then, rubbing this by rayon along one direction.

REFERENCE EXAMPLE 2

Under an inert atmosphere, 90 g of 3-bromophenol was dissolved in 600 ml of ethanol. Further, 39 g potassium hydroxide was added to this and the mixture was heated up to 70° C. for dissolution thereof. From a dropping funnel, 126 g of 3,7-dimethylbromooctane was dropped over 15 minutes. After completion of dropping, the mixture was heated to 84° C. and stirred for about 22 hours under heat. After completion of heating, the mixture was left to cool to room temperature. The reaction solution was bisected, 500 ml of water was added to respective portions, then, ethanol was distilled off by an evaporator. The solutions after distilling off of ethanol were combined and trisected, 300 ml of ethyl acetate was added to respective portions to cause liquid separation, and the organic layers were washed with 200 ml of water twice. The organic layers were combined and the solvent was distilled off by an evaporator, then, the residue was dried by heating at 90° C. for 5 hours under vacuum by a rotary pump. About 150 g of 3-(3,7-dimethyloctyloxy)-bromobenzene was obtained as an oily product.

Compound F

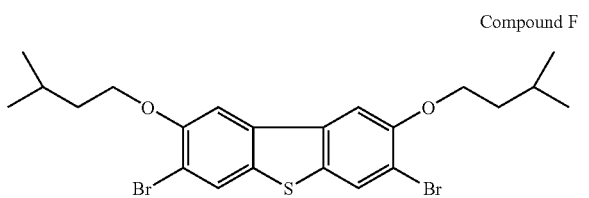

299 mg of compound E, 259 mg of compound F and 312 mg of 2,2'-bipyridyl was dissolved in 20 ml of dehydrated tetrahydrofuran, then, the system was purged with nitrogen by babbling of nitrogen. Under a nitrogen atmosphere, 550 mg of bis(1,5-cyclooctadiene) nickel (O) {Ni(COD)$_2$} was added to this solution, and the mixture was heated up to 60° C. and reacted for 3 hours. After the reaction, this reaction solution was cooled to room temperature (about 25° C.), and dropped in a mixed solution of 10 ml of 25% ammonia water/120 ml of methanol/50 ml of ion exchanged water and the mixture was stirred for 1 hours, then, the deposited precipitate was filtrated and dried under reduced pressure for 2 hours, and dissolved in 30 ml of toluene. Thereafter, 30 ml of 1 N hydrochloric acid was added and the mixture was stirred for 1 hour, the aqueous layer was removed and 30 ml of 4% ammonia water was added to the organic layer, and the resulted mixture was stirred for 1 hour, hen, the aqueous layer was removed. The organic layer was dropped in 200 ml of methanol and the resulted mixture was stirred for 1 hour, the deposited precipitate was filtrated and dried under reduced pressure for 2 hours, and dissolved in 30 ml of toluene. Thereafter, the solution was purified through an aluminum column (alumina amount: 5 g), and the recovered toluene solution was dropped in 250 ml of methanol, the mixture was stirred for 1 hour, and the deposited precipitate was filtrated and dried under reduced pressure for 2 hours. The yield of the resulted polymer was 155 mg. This polymer is referred to as polymer 1.

The average molecular weight in terms of polystyrene of polymer 1 was Mn=9.0×10$^4$ and Mw=2.0×10$^5$.

Under an inert atmosphere, 7.5 g of magnesium and a small amount of iodine were charged in 100 ml of dried tetrahydrofuran in a three-necked flask. Using a dropping funnel, 90 g of the above-mentioned 3-(3,7-dimethyloctyloxy)-bromobenzene was dropped over 50 minutes. After completion of dropping, 200 ml of dried tetrahydrofuran was added, and the mixture was stirred while heating for 2 hours under reflux to prepare a Grignard reagent. After completion of heating, the reagent was left to cool to room temperature. Into a three-necked flask other than the above-mentioned flask was charged 38 g of trimethylboric acid and 300 ml of dried tetrahydrofuran, and the flask was cooled in a dry ice/aceton bath. Using a dropping funnel, the above-mentioned Grignard reagent solution was dropped over 35 minutes. After completion of dropping, the reaction solution was heated up to room temperature. The reaction solution was added to dilute sulfuric acid (sulfuric acid 12 ml/water 360 ml) and the mixture was stirred, then, bisected and the portions were extracted with 150 ml of ethyl acetate and 100 ml ethyl acetate, respectively. The organic layers were combined, then, trisected and respective portions were washed with 100 ml of water. The washed organic layers were combined and the solvent was distilled off by an evaporator, then, 100 ml of hexane was added to suspend a solid component and the suspension was filtrated. Further, the filtrated substance was washed with 100 ml of hexane. 63 g of 3-(3,7-dimethyloctyloxy)-phenylboric acid was obtained in the form of while solid. Under an inert atmosphere, into a three-necked flask was charged 60 g of the above-mentioned 3-(3,7-dimethyloctyloxy)-bromobenzene, 250 ml of toluene, 250 ml of water, 62 g of potassium carbonate and 1.2 g of tetrakis(triphenylphosphine)palladium complex. Argon was bubbled through the solution for 20 minutes to remove oxygen, then, 63 g of the above-mentioned 3-(3,7-dimethyloctyloxy)-phenylboric acid was added and the mixture was heated up to 90° C., and stirred for 8 hours while heating at the same temperature. After completion of heating, the mixture was left to cool to room temperature. The toluene layer was separated, then, a colored component was removed by silica gel column chromatography. The solvent was distilled off to obtain 98 g of an oily product. This is referred to as compound G.

ether. The organic layers were combined and washed with a saturated sodium hydrogen carbonate aqueous solution and saturated saline. The mixture was dried over sodium hydrogen sulfate, and the solvent was distilled off, to obtain 6.66 g of a crude product. This is referred to as compound I.

In an argon-purged 300 ml three-necked flask, 5.00 g of compound I (purity 85.1%, 6.6 mmol) was placed and dissolved in 65 ml of dehydrated DMF. Into this solution was charged 2.45 g (13.8 mmol) of N-bromosuccinimide. The mixture was stirred at room temperature for 5 hours, then, extracted with 80 ml×5 of hexane in a globe box. The solvent was distilled off to obtain 14.02 g of a crude product (LC 19.9%, containing DMF). After separating by reverse phase silica gel column chromatography (acetonitrile:toluene=20: 1), the fraction was extracted with hexane (for removing a trace amount of acetic acid in acetonitrile), and washed with a 5% sodium hydrogen carbonate aqueous solution and saturated saline, and dried over sodium sulfate, then, the solvent was distilled off to obtain 0.30 g of compound J.

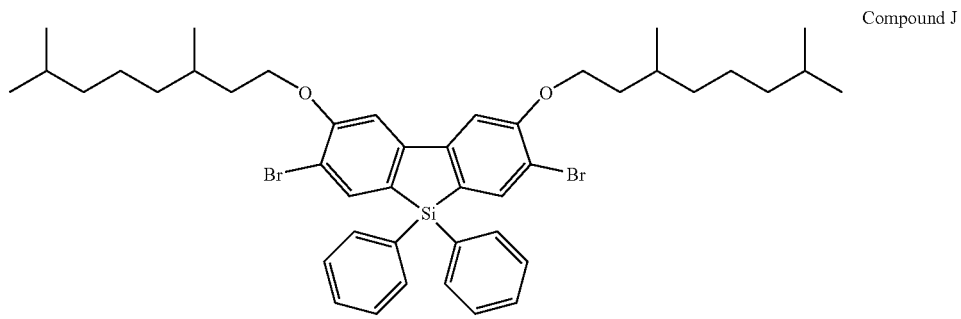

Compound J 20 g of the above-mentioned compound G was dissolved in 400 ml of dried N,N-dimethylformamide. Under ice cool, a solution was N-bromosuccinimide 15.5 g/N,N-dimethylformamide 300 ml was dropped. This was dropped over 90 minutes. After completion of dropping, the ice bath was removed and the mixture was stirred over night. The solvent was distilled off, then, the residue was dissolved in 200 ml of toluene, the resulted solution was washed with 200 ml of water three times, then, the solvent was distilled off to obtain 26 g of an oily product. This is referred to as compound H.

A 200 ml four-necked flask was purged with argon, 5.00 g (8.0 mmol) of compound H was dissolved in 80 ml of dehydrated ether, and the solution was cooled to −78%. To this solution, 11 ml of n-butyllithium (17.6 mmol, 1.6 M hexane solution) was dropped, and the mixture was stirred for 3.5 hours. This solution was dropped in 500 ml of an ether solution of 25.8 g (152 mmol) of silicon tetrachloride cooled to −78° C. After stirring for 1 hour, the mixture was heated up to room temperature, and stirred for 15 hours. The reaction solution was filtrated under argon, and the filtrate was concentrated to obtain 4.52 g of crude product.

The crude product obtained above was placed in an argon-purged 500 ml three-necked flask and dissolved in 90 ml of dehydrated ether, and the solution was cooled to −78%. To this solution, 23 ml of phenyllithium (24 mmol, 1.06 M cyclopentane/ether solution) was dropped. After stirring for 20 minutes, the mixture was heated up to room temperature and stirred for 4 hours. Water was added to this to cause liquid separation, and the aqueous layer was extracted with diethyl 504 mg of compound J and 320 mg of 2,2'-bipyridyl were charged in a reaction vessel, then, the reaction system was purged with an argon gas. To this was added 20 ml of tetrahydrofuran (dehydrated solvent) deaerated by bubbling with an argon gas previously. Next, to this mixed solution was added 600 mg of bis(1,5-cyclooctadiene) nickel (0), the mixture was stirred at room temperature for 10 minutes, then, reacted for 3 hours at 60° C. The reaction was conducted in a nitrogen gas atmosphere.

After the reaction, this reaction solution was cooled to room temperature (about 25° C.), and dropped in a mixed solution of 25% ammonia water 10 ml/methanol 120 ml/ion exchanged water 50 ml, and the mixture was stirred for 1 hour, then, the deposited precipitate was filtrated and dried under reduced pressure for 2 hours. And dissolved in 30 ml of toluene. Thereafter, 30 ml of 1 N hydrochloric acid was added and the mixture was stirred for 1 hour, the aqueous layer was removed, and 30 ml of 4% ammonia water was added, the mixture was stirred for 1 hour, then, the aqueous layer was removed. The organic layer was drooped in 200 ml of methanol and the mixture was stirred for 1 hour, the deposited precipitate was filtrated and dried under reduced pressure for 2 hours, and dissolved in 30 ml of toluene. Thereafter, the solution was purified through an aluminum column (alumina amount 5 g), and the recovered toluene solution was dropped in 250 ml of methanol and the mixture was stirred for 1 hour, and the deposited precipitate was filtrated and dried under reduced pressure for 2 hours. The yield of the resulted polymer was 90 mg. This polymer is referred to as polymer 2. This polymer 2 had a polystyrene-reduced number-average molecular weight of $4.4 \times 10^4$, and a polystyrene-reduced weight-average molecular weight of $1.0 \times 10^5$.

Polymer 2 was observed by a polarization microscope by the same manner as for polymer 1, as a result, polymer 2 manifested transition to a liquid crystal phase around 120° C., showing an orientation property.

<Fabrication of Device for Measuring Time of Flight and Measurement of Hole Mobility>

0.015 g of polymer 2 was weighed and toluene was added to this up to 1 g, preparing a toluene solution of polymer 2.

The above obtained toluene solution of polymer 2 was cast to form a film having a thickness of 4.1 μm on a transparent conductive film (ITO) formed on glass. Further, an Al electrode was vapor-deposited by a vacuum vapor deposition method on the film of polymer 2, to obtain a sample for measuring time of flight. On this sample, positive voltage was applied on the transparent electrode against the Al electrode, and flash light (wavelength: 337 nm, flash time: 1 nsec) was introduced from the transparent electrode side using a nitrogen laser, and the transition photocurrent of hole was measured. The hole mobility was calculated from an inflection point on log-log plot of time-transition photocurrent. As a result, a hole mobility of $6 \times 10^{-4}$ cm$^2$/V/s was obtained at a measuring temperature of 27° C. and an applied voltage of 200 V (electric field strength: up to 0.5 MV/cm).

EXAMPLE 1

<Fabrication of Polymer Film Device and Measurement of Solar Battery Property>

A suspension of poly (3,4) ethylene dioxythiophene/polystyrenesulfonic acid (manufactured by Bayer, Baytron P AI 4083) was filtrated through a 0.2 μm membrane filter, then, spin-coated to form a film having a thickness of 70 nm on a glass substrate carrying an ITO film having a thickness of 150 nm provided by a sputtering method, and dried on a hot plate at 200° C. for 10 minutes. Then, a polymer film having a thickness of 70 nm was formed by spin coating at room temperature using a 1.5 wt % toluene solution of polymer 1. Further, this was dried at 60° C. for 1 hour under reduced pressure, then, about 0.2 nm of lithium fluoride, then, 5 nm of calcium, further, 180 nm of aluminum were vapor-deposited as an electrode, to produce polymer film device using polymer 1. The degrees of vacuum in vapor deposition were all $11 \times 10^{-4}$ Pa or less. While irradiating the resulted film device with xenon lamp, a voltage-current property was measured. As a result, solar battery properties of a short-circuit current of 30 μA/cm$^2$ and an open-circuit voltage of 1.8 V were obtained.

EXAMPLE 2

<Fabrication of Polymer Film Device and Measurement of Solar Battery Property>

A polymer film device was produced in the same manner as in Example 1 using polymer 2 instead of polymer 1. While irradiating the resulted film device with xenon lamp, a voltage-current property was measured. As a result, a short-circuit current of 25 μA/cm$^2$ and an open-circuit voltage of 1.1 V were obtained.

EXAMPLE 3

<Measurement of Optical Sensor Property>

Using the polymer film device using polymer 1 produced in Example 1, properties as an optical sensor were evaluation. While irradiating with xenon lamp, a voltage-current property was measured. As a result, a photo-current of 97 mA/cm$^2$ flowed at an applied voltage of 3.6 V. When measured without irradiating with xenon lamp, a dark-current of 26 mA/cm$^2$ flowed at an applied voltage of 3.6 V.

INDUSTRIAL APPLICABILITY

The present invention relates to a polymer film containing a polymer having liquid crystallinity and having an electron mobility or hole mobility of $10^{-5}$ cm$^2$/Vs or more. This polymer film is useful as a film for various polymer film devices such as an organic transistor, organic solar battery, optical sensor, electrophotographic photoreceptor, spatial light modulator, photorefractive device and the like.

The invention claimed is:

1. A polymer film comprising a polymer having liquid crystallinity, having a number-average molecular weight in terms of polystyrene of $10^3$ to $10^8$ and having an electron mobility or hole mobility of $10^{-5}$ cm$^2$/Vs or more, and having a film thickness in the range from 1 nm to 100 μm, wherein the polymer contains repeating units of the following formula (1-1), (1-2), (1-3), (1-4) or (1-5):

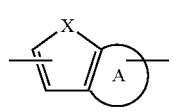

(1-1)

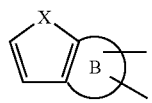

(1-2)

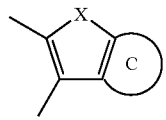

(1-3)

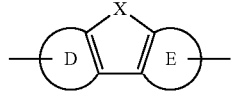

(1-4)

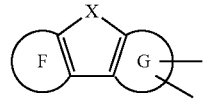

(1-5)

wherein X represents a hetero atom or a divalent group containing hetero atoms, and A ring, B ring, C ring, D ring, E ring, F ring and G ring each represent independently an aromatic ring optionally having a substituent selected from the group consisting of alkyl groups, alkoxy groups, alkylthio groups, aryl groups, aryloxy groups, arylthio groups, arylalkyl groups, arylalkoxy groups, arylalkylthio groups, arylalkenyl groups, arylalkynyl groups, amino groups, substituted amino groups, silyl group, substituted silyl groups, halogen atoms, acyl groups, acyloxy groups, imino groups, amide groups, imide groups, monovalent heterocyclic groups, carboxyl group, substituted carboxyl groups and cyano group.

2. The polymer film according to claim 1 wherein X represents S, O or SiRR' (wherein, R and R' each represent independently a hydrogen atom, a halogen atom, a hydroxyl group, an alkyl group, an alkoxy group, an alkylthio group, an aryl group, an aryloxy group, an arylthio group, an arylalkyl group, an arylalkoxy group, an arylalkylthio group, a substituted amino group, or a monovalent heterocyclic group).

* * * * *